(12) United States Patent
Takahashi

(10) Patent No.: US 7,147,482 B1
(45) Date of Patent: Dec. 12, 2006

(54) TWO-POINT CONTACT TYPE SOCKET

(75) Inventor: Wataru Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/281,388

(22) Filed: Nov. 18, 2005

(30) Foreign Application Priority Data

Aug. 23, 2005 (JP) .............................. 2005-241647

(51) Int. Cl.
*H01R 12/00* (2006.01)
(52) U.S. Cl. ..................................... 439/72
(58) Field of Classification Search ................. 439/72, 439/71, 73, 331, 68
See application file for complete search history.

(56) References Cited

U.S. PATENT DOCUMENTS

| | | | | |
|---|---|---|---|---|
| 4,026,412 A | * | 5/1977 | Henson | 206/728 |
| 4,037,270 A | * | 7/1977 | Ahmann et al. | 361/689 |
| 4,668,870 A | * | 5/1987 | Okura | 250/577 |
| 4,688,870 A | * | 8/1987 | Egawa et al. | 439/331 |
| 5,975,915 A | * | 11/1999 | Yamazaki et al. | 439/72 |

FOREIGN PATENT DOCUMENTS

| | | |
|---|---|---|
| JP | 2001-357951 | 12/2001 |
| JP | 2003-157939 | 5/2003 |
| JP | 2003-303653 | 10/2003 |
| JP | 2004-103432 | 4/2004 |

\* cited by examiner

*Primary Examiner*—Phuong Dinh
(74) *Attorney, Agent, or Firm*—Westerman, Hattori, Daniels & Adrian, LLP.

(57) ABSTRACT

A two-point contact type socket makes an electric contact with a terminal of an electronic component. A first contact piece is to be brought into contact with a first side of the terminal of the electronic component. A second contract piece is to be brought into contact with a second side opposite to the first side of the terminal of the electronic component. The second contact piece is formed of a linear conductor. The first contact piece has a portion to be brought into contact with the second contact piece when the second contact piece is in contact with the terminal of the electronic component.

8 Claims, 3 Drawing Sheets

TWO-POINT CONTACT TYPE SOCKET

BACKGROUND OF THE INVENTION

1. Field of the Invention

The present invention relates to sockets for electronic parts and, more particularly, to a two-point contact type socket having contacts that are simultaneously brought into contact with upper and lower surfaces of a terminal of an electronic equipment such as a large-scale integrated circuit (LSI).

2. Description of the Related Art

In recent years, many flat-package type LSIs are used in portable electronic equipments such as a digital camera, etc. Since the flat-package type LSI having fine pitch terminals has a small electric contact area, a contact failure tends to occur when conducting an electric test. Thus, a two-point contact socket is used, which permits a stable electric test of a flat-package type LSI (for example, refer to the following patent documents 1 trough 4).

Especially, in an LSI socket (sample table) used for a final test or a characteristic evaluation test of an LSI, an electric contact portion between the LSI and the socket is getting smaller. However, as a bad effect, there is a problem in that a test failure occurs or a characteristic evaluation must be done again due to a bad contact. The cause of such a bad contact is that it tends to receive influences of dirt and dust adhering on a contact surface, a spot on a contact surface or a deformation of a terminal due to a reduction in the contact area caused by the terminals being arranged with a fine pitch. Thus, the contact of a two-point contact structure is used, which contacts with terminals of an LSI by sandwiching the terminals from both vertical directions.

[Patent Document 1]
Japanese Laid-Open Patent Application No. 2001-357951 (FIGS. 5–7)

[Patent Document 2]
Japanese Laid-Open Patent Application No. 2004-103432 (FIGS. 1–6)

[Patent Document 3]
Japanese Laid-Open Patent Application No. 2003-157939 (FIG. 2, FIG. 8, FIG. 9)

[Patent Document 4]
Japanese Laid-Open Patent Application No. 2003-303653 (FIGS. 1–6)

Recently, the number of signal terminals of a flat-package type LSI is increasing to 100–200. With such a development in making the fine pitch structure, it is apparent that a possibility of occurrence of contact failure with respect to supply of an electric current is increased more. In many cases, a second contact piece to be brought into contact with an upper side of an LSI terminal is made of a conductive material piece (single piece lead) formed by mold forming. However, a pitch between LSI terminals has been made smaller, and, thereby, it has become difficult to arrange the second contact pieces on the upper sides of the LSI terminals at an equal interval (pitch). Additionally, even if the second contact pieces are arranged at an equal interval, a pitch variation may occur due to a mechanical action such as an elastic deformation of the second contact pieces, which causes a problem in that adjacent contact pieces short-circuit with each other.

Moreover, in a current two-point contact type socket, the upper contact piece to be brought into contact with an LSI terminal from an upper side deforms and displaces when making a contact, and, thus, degradation with passage of time occurs in the upper contact piece. Accordingly, it is necessary to conduct a maintenance operation such as a replacement when degraded with passage of time. Thus, it is desirous to develop a two-point contact type socket having a structure in which all upper contact pieces can be replaced at once.

Furthermore, since the upper side contact piece of the current two-point contact type socket uses a spring property which elastically deforms while drawing a trajectory, a socket structure is in consideration of a space for allowing a deformation of the upper contact piece, which causes a problem in that the socket itself is very large. Thus, it is desirous to develop a two-point contact type socket which is smaller than a current one and an operation of the contact piece therein is simple.

SUMMARY OF THE INVENTION

It is a general object of the present invention to provide an improved and useful two-point contact type socket in which the above-mentioned problems are eliminated.

A more specific object of the present invention is to provide a two-point contact type socket which can realize a two-point contact without an upper contact piece being deformed or displaced.

In order to achieve the above-mentioned object, there is provided according to the present invention a two-point contact type socket for making an electric contact with a terminal of an electronic component, comprising: a first contact piece to be brought into contact with a first side of the terminal of the electronic component; and a second contract piece to be brought into contact with a second side opposite to the first side of the terminal of the electronic component, wherein the second contact piece is formed of a linear conductor, and the first contact piece has a portion to be brought into contact with the second contact piece when said second contact piece is in contact with the terminal of the electronic component.

According to the present invention, the second contact piece is a mere linear conductor, which does not have a portion that deforms or displaces when making a contact with the terminal of the electronic component, thereby achieving a stable contact. Additionally, since the second contact piece does not have a portion that deforms or displaces, there is no change in an interval between adjacent second contact pieces. Thus, a contact position of each second contact piece and a corresponding terminal of the electronic component can be maintained at high accuracy.

Other objects, features and advantages of the present invention will become more apparent from the following detailed description when read in conjunction with the accompanying drawings.

DETAILED DESCRIPTION OF THE PREFERRED EMBODIMENTS

Figure 1:
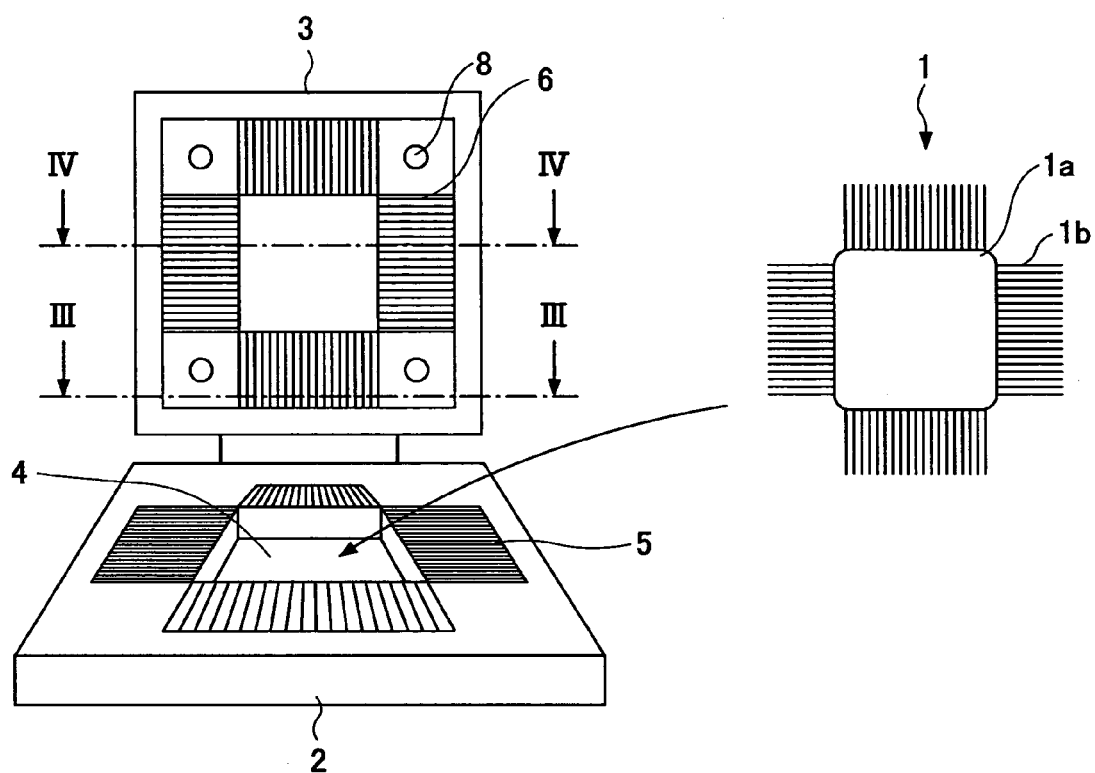
FIG. 1 is a perspective view of a two-point contact type socket according to an embodiment of the present invention.

A description will now be given, with reference to FIG. 1, of a two-point contact type socket according to an embodiment of the present invention. FIG. 1 is a perspective view of a two-point contact type socket according to an embodiment of the present invention.

The two-point contact type socket shown in FIG. 1 is a socket for making an electric contact with terminals of an electronic component when performing an electric test of the electronic component, which has the terminals extending from a package body such as an LSI or an IC. In the present embodiment, the flat-package type LSI (hereinafter, simply referred to as an LSI 1) such as shown in FIG. 1 is described as an example of an electronic component.

The two-point contact type socket shown in FIG. 1 comprises a socket body 2 and a lid part 3. The socket body 2 may be referred to as a sample stage, and has a recessed portion 4 formed at the center thereof to accommodate a package body 1a of the LSI 1. First contact pieces (lower-side contact pieces) 5 are provided around the recessed portion 4 at positions corresponding to respective terminals 1b of the LSI 1 to be accommodated in the recessed portion 4.

The lid part 3 is rotatably supported on a side of the socket body 2 by a hinge mechanism or the like. FIG. 1 shows a state where the lid part 3 is lifted and opened and the recessed portion 4 of the socket body 2 is exposed. The lid part 3 has conductive stripes 6 as second contact pieces formed thereon. The conductive stripes 6 are provided so as to be positioned directly above the first contact pieces 5 of the socket body 2 when the lid part 3 is closed and overlapped with the socket body 2.

Figure 2:
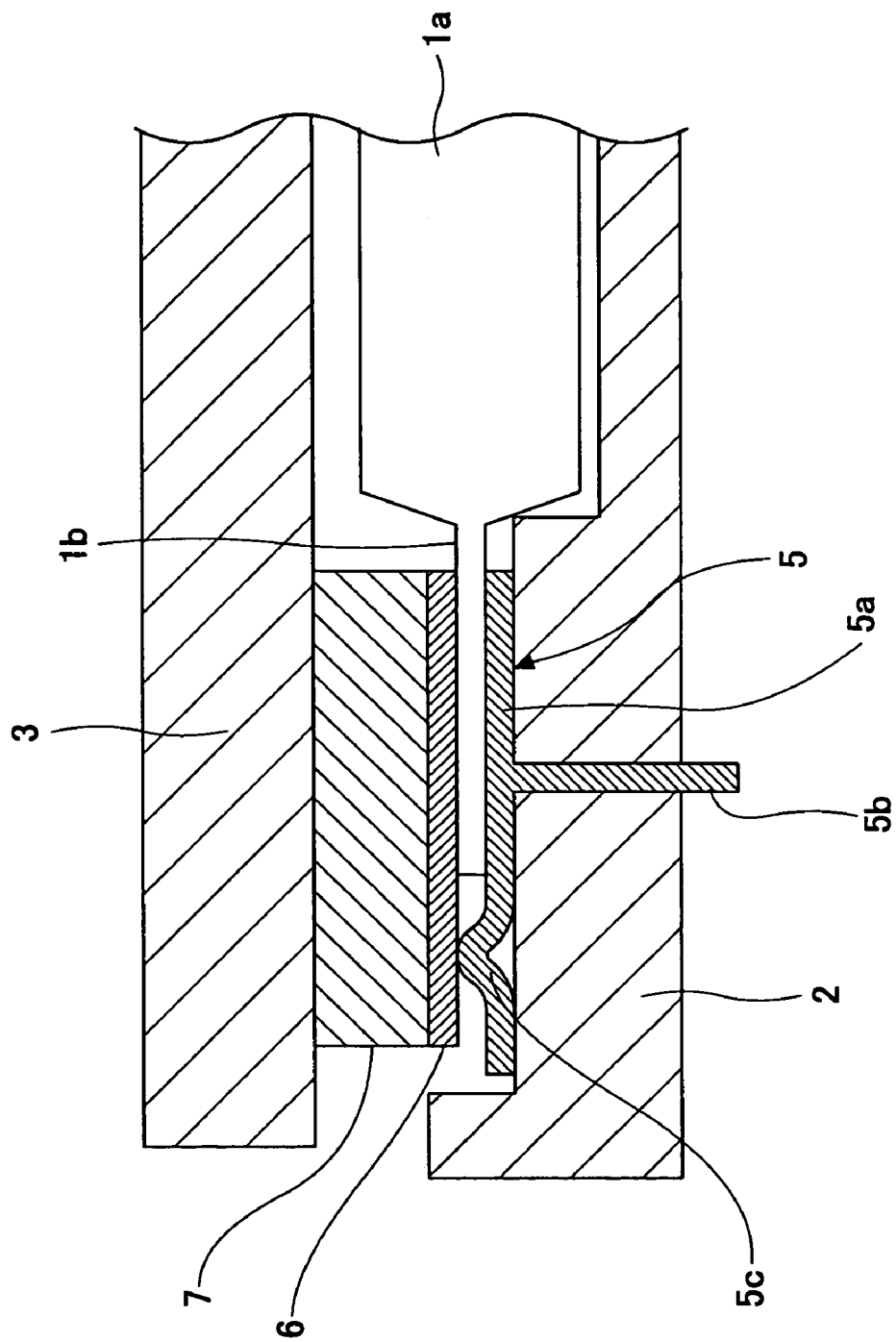
FIG. 2 is a cross-sectional view of a part of the two-point contact type socket shown in FIG. 1.

FIG. 2 is a cross-sectional view showing a part of the two-point contact type socket shown in FIG. 1. In FIG. 2, a state where the lid part 3 is closed is shown.

When the lid part 3 is opened and the socket body 3 of the package body 1a of the LSI 1 is accommodated in the recessed portion 4, the terminals 1b of the LSI 1 are placed on the first contact pieces 5 provided around the recessed portion 4. Each of the first contract pieces 5 has the same width as each of the terminal 1b of the LSI 1, and the first contact pieces 5 are arranged at the same pitch as the terminal 1b of the LSI 1. Accordingly, each of the first contact pieces 5 is in contact with the respective one of the terminals 1b of the LSI 1 in the state where the LSI 1 is accommodated in the socket body 3.

The first contact pieces 5 are formed by processing a metal piece (for example, beryllium copper) having elasticity. Each of the first contract pieces 5 has a contact portion 5a, which is brought into contact with the terminal 1b of the LSI 1, a terminal portion 5b, which extends from the socket body 2 toward outside and serves as a connection terminal, and a protruding portion 5c, which protrudes upward in a portion where the terminal 1b of the LSI 1 does not exist. As mentioned later, the protruding part 5c is configured and arranged to be brought into contact with a conductive stripe 6 provided in the lid part 3.

A frame-shaped insulator 7 which corresponds to an area of arranging the terminals 1b of the LSI 1, is fixed to the lid part 3 and the above-mentioned stripes 6 are formed on the insulator 7. The conductive stripes 6 are arranged in the same manner as that of the first contact pieces 5, and, thus, the conductive stripes 6 are arranged in the same arrangement as that of the terminals 1b of the LSI 1.

The insulator 7 is formed of a material which is used as an insulator of a circuit board such as, for example, a glass-epoxy resin. The conductive stripe 6, which is a second contact piece, is a liner conductor, and can be formed by a copper alloy being formed in a liner pattern. The material and the forming method of the conductive stripe 6 are not limited to the above-mentioned material and method, and various materials and forming methods may be used as long as they can form linear conductors.

The insulator 7 is provided with through holes 8 so that the insulator 7 can be detachably attached to the lid part 3 by using a fixing means such as a bolt or the like. Accordingly, by detaching the insulator 7 from the lid part 3, the conductive stripes 6 can be removed from the lid part 3 all at once.

Figure 3:
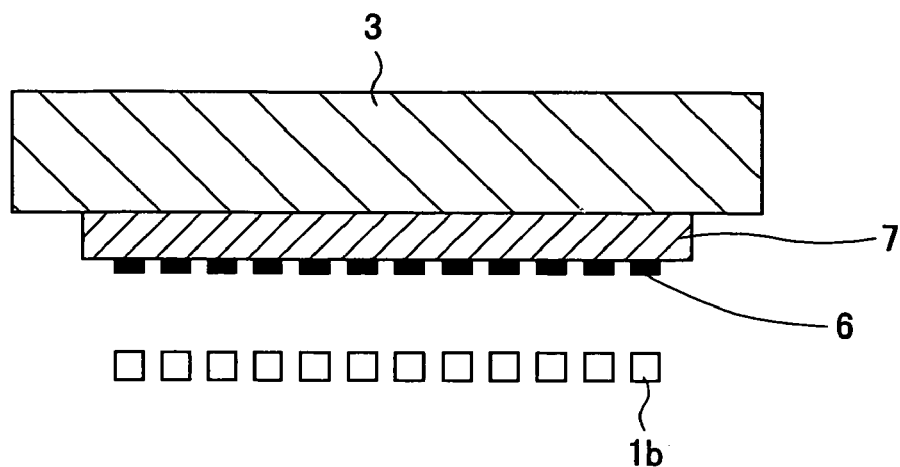
FIG. 3 is a cross-sectional view taken along a line III—III of FIG. 1.
Figure 4:
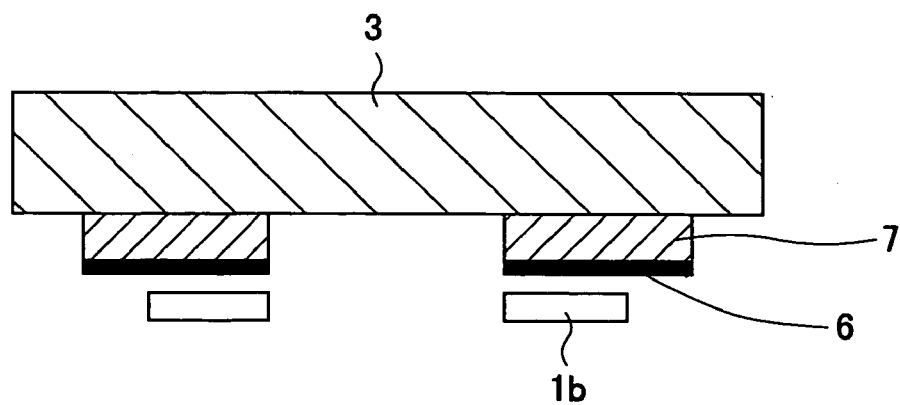
FIG. 4 is a cross-sectional view taken along a line IV—IV of FIG. 1.

FIG. 3 is a cross-sectional view taken along a line III—III of FIG. 1, and the terminals 1b of the LSI 1 are shown together in for reference. FIG. 4 is a cross-sectional view taken along a line IV—IV line of FIG. 1, and the terminals 1b of the LSI 1 are shown together for reference. In FIG. 3 and FIG. 4, the conductive stripes 6 are illustrated in a hyperbolized manner for the sake of convenience, and the size and the number of the conductive stripes 6 are not equal to that indicated in FIG. 1.

Each of the conductive stripes 6, which is a second contact piece, has substantially the same width as each of the terminals 1b of the LSI 1, and the conductive stripes 6 are arranged at the same pitch as the terminals 1b of the LSI 11. Additionally, the conductive stripes 6 are arranged so as to extend along the terminals 1b of the LSI 1. However, the conductive stripes 6 are formed longer tan the terminals 1b of the LSI 1 so that the conductive stripes 6 are brought into contact with the protruding portions 5c of the first contact pieces 5, as shown in FIG. 2, when the lid part 3 is closed.

In the above-mentioned structure, when the LSI 1 is accommodated in the socket body 2 and the lid part 3 is closed, as shown in FIG. 2, each of the terminals 1b of the LSI 1 is sandwiched between one of the first contact pieces 5 and one of the conductive stripes 6, which is a second contact piece. In addition, the protruding portion 5c of each of the first contact pieces 5 is brought into contact with the respective one of the conductive stripes 6, which results in each of the conductive stripes 6 being electrically connected with the respective one of the first contact pieces 5. Since the protruding portion 5c of each of the first contact pieces 5 is formed in an elastically deformable form, the protruding portion 5c elastically deforms when one of the stripes 6 is brought into contact with the protruding portion 5c and is pressed against the protruding portion 5c, thereby achieving a positive electrical conduction with the conductive stripe 6.

According to the two-pint contact type socket of the embodiment having the above-mentioned structure, each of the contact stripes 6, which is a second contact piece, is mere a linear conductor, and, thus, there is no portion that may deform or displace when brought into contact with the terminals 1b of the LSI 1, thereby achieving a stable contact. Additionally, since each conductive stripe 6 does not have a portion that deforms or displaces, there is no situation where an interval between adjacent conductive stripes 6, that is, a pitch of the conductive stripes 6 goes out of order. Therefore, a contact position of each of the conductive stripes 6 and the respective one of the terminals 1b of the LSI 1 is maintained with high accuracy.

Moreover, since the conductive stripes 6, which are the second contact pieces, are incorporated into the lid part 3, the socket according to the present embodiment can be miniaturized as compared to a conventional two-point contact type socket and the two-point contact type socket can be constituted with substantially the same size as a single-point contact type socket.

Moreover, since the conductive stripes 6 are linear conductors formed on the insulator 7, a positional relationship in arrangement of the conductive stripes 6 does not go out of order. Further, since the insulator 7 is detachably attached to the lid part, the conductive stripes 6 can be replaces all at once by performing the replacement by removing the insulator 7 from the lid part 3. Additionally, the protruding portions 5c provided in the first contact pieces 5 can make an electric contact with the respective conductive stripes 6 by being deformed slightly, thereby achieving a positive two-point contact.

The present invention is not limited to the specifically described embodiment, and variations and modifications may be made without departing from the scope of the present invention.

The present invention is based on Japanese priority application No. 2005-241647 filed Aug. 23, 2005, the entire contents of which are incorporated herein by reference.

What is claimed is:

1. A two-point contact type socket for making an electric contact with a terminal of an electronic component, comprising:
    a first contact piece to be brought into contact with a first side of the terminal of the electronic component; and
    a second contract piece to be brought into contact with a second side opposite to the first side of the terminal of the electronic component,
    wherein the second contact piece is formed of a linear conductor, and said first contact piece has a portion to be brought into contact with said second contact piece when said second contact piece is in contact with said terminal of said electronic component.

2. The two-point contact type socket as claimed in claim 1, wherein said first contact piece is provided in a socket body in which said electric component is accommodated, and said second contact piece is provided in a lid part that is rotatably supported on the socket body.

3. The two-point contact type socket as claimed in claim 2, wherein said second contact piece is a linear conductor formed by printing on a surface of an insulator provided in said lid part.

4. The two-point contact type socket as claimed in claim 3, wherein said insulator is detachably attached to said lid part.

5. The two-point contact type socket as claimed in claim 1, wherein said portion of said first terminal is an elastically-deformable protruding part that protrudes toward said second contact piece when said lid part is closed.

6. The two-point contact type socket as claimed in claim 2, wherein said portion of said first terminal is an elastically-deformable protruding part that protrudes toward said second contact piece when said lid part is closed.

7. The two-point contact type socket as claimed in claim 3, wherein said portion of said first terminal is an elastically-deformable protruding part that protrudes toward said second contact piece when said lid part is closed.

8. The two-point contact type socket as claimed in claim 7, wherein said insulator is detachably attached to said lid part.

* * * * *